(12) United States Patent
Furukawa

(10) Patent No.: US 7,205,225 B2
(45) Date of Patent: Apr. 17, 2007

(54) METHOD OF MANUFACTURING A SEMICONDUCTOR DEVICE AND SEMICONDUCTOR DEVICE OBTAINED BY USING SUCH A METHOD

(75) Inventor: Yukiko Furukawa, Leuven (BE)

(73) Assignee: NXP, B.V., Eindhoven (NL)

( * ) Notice: Subject to any disclaimer, the term of this patent is extended or adjusted under 35 U.S.C. 154(b) by 20 days.

(21) Appl. No.: 10/544,519

(22) PCT Filed: Jan. 15, 2004

(86) PCT No.: PCT/IB2004/050026

§ 371 (c)(1),
(2), (4) Date: Aug. 3, 2005

(87) PCT Pub. No.: WO2004/070831

PCT Pub. Date: Aug. 19, 2004

(65) Prior Publication Data

US 2006/0166483 A1   Jul. 27, 2006

(30) Foreign Application Priority Data

Feb. 3, 2003 (EP) ................................. 03100214

(51) Int. Cl.
   *H01L 21/4763* (2006.01)
(52) U.S. Cl. .................. 438/624; 438/758; 438/633; 438/738; 257/E21.579
(58) Field of Classification Search .............. 438/624, 438/758, 633, 738
   See application file for complete search history.

(56) References Cited

U.S. PATENT DOCUMENTS 6,040,628 A * 3/2000 Chiang et al. ............... 257/760
6,165,898 A * 12/2000 Jang et al. ................... 438/638
6,362,093 B1 * 3/2002 Jang et al. ................... 438/633
6,518,191 B2 * 2/2003 Nakagawa ................... 438/710

* cited by examiner

Primary Examiner—Asok K. Sarkar
Assistant Examiner—Victor V. Yevsikov
(74) Attorney, Agent, or Firm—Peter Zawilski

(57) ABSTRACT

The invention relates to a method of manufacturing a semiconductor device (10) with a semiconductor body (1) and a substrate (2) comprising at least one semiconductor element (3) and provided with at least one connection region (4) and an overlying stripe-shaped connection conductor (5) which is connected to the connection region (4), which connection conductor and connection region are both recessed in a dielectric material, where subsequently a first dielectric layer (6), a hard mask layer (7), and a second dielectric layer (8) are deposited on the semiconductor body (1), where at the location of the connection region (4) to be formed, a via (44) is formed in the first dielectric layer (6) by means of plasma etching using a plasma containing a compound of carbon and fluor, and in the presence of a patterned photoresist layer deposited on top of the structure and at the location of the connection conductor (6) to be formed, a trench (55) is formed in the second dielectric layer (8) by means of plasma etching, which via (44) and trench (55) are filled with an electrically conducting material in order to form, respectively, the connection region (4) and the connection conductor (5), and where before the trench (55) is formed, the already formed via (44) is filled with an organic material (20). According to the invention, the material of the first dielectric layer (6) and the etch conditions during formation of the via (44) in the first dielectric layer (6) by plasma etching are chosen such that during etching the via (44), said via (44),said via (44) is at the same time substantially completely filled with the organic material (20), which organic material (20) is formed from organic material already present within the structure and within the plasma. Relevant conditions—apart from the presence of the resist layer during etching and the use therein of a compound of carbon and fluor—relate to the choice of the material of the first (and second) dielectric layer(s) 6,8 and the power during etching of these layers (6,8).

15 Claims, 3 Drawing Sheets

METHOD OF MANUFACTURING A SEMICONDUCTOR DEVICE AND SEMICONDUCTOR DEVICE OBTAINED BY USING SUCH A METHOD

The invention relates to a method of manufacturing a semiconductor device with a semiconductor body and a substrate comprising at least one semiconductor element and provided with at least one connection region and an overlying stripe-shaped connection conductor which is connected to the connection region, which connection conductor and connection region are both recessed in a dielectric material, where subsequently a first dielectric layer, a first hard mask layer, and a second dielectric layer are deposited on the semiconductor body, where at the location of the connection region to be formed, a via is formed in the first dielectric layer by means of plasma etching using a plasma containing compounds of carbon and fluor, and at the location of the connection conductor to be formed, a trench is formed in the second dielectric layer by means of plasma etching and a patterned photoresist layer is present on top of the structure during etching, which via and trench are filled with an electrically conducting material in order to form, respectively, the connection region and the connection conductor, and where before the trench is formed, the already formed via is filled with an organic material. Such a method is particularly suitable for the manufacturing of more complex semiconductor devices that are manufactured in the so-called multi-level or multi-layer technique.

Figure 1:
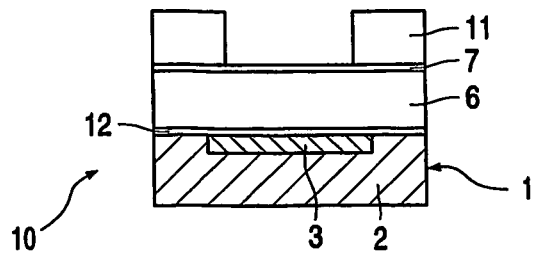
Figure 2:
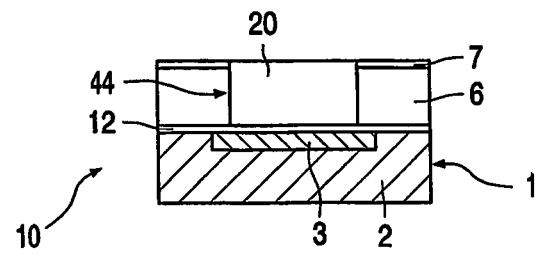
Figure 3:
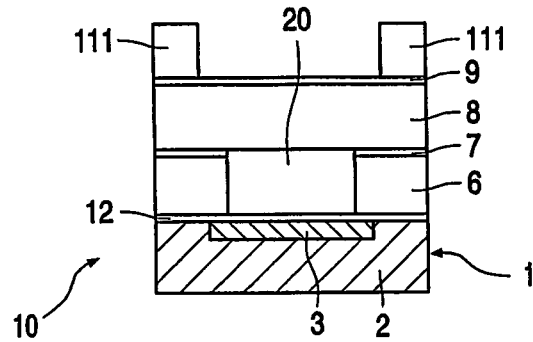
Figure 4:
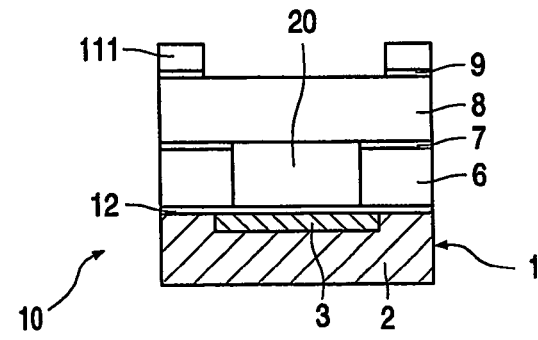
Figure 5:
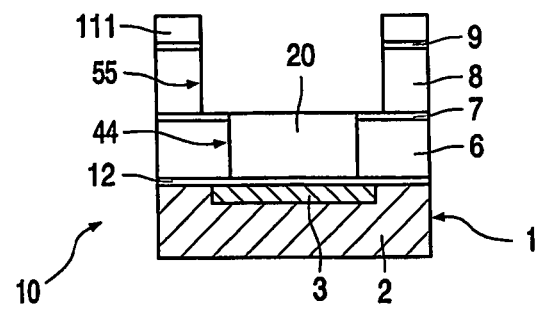
Figure 6:
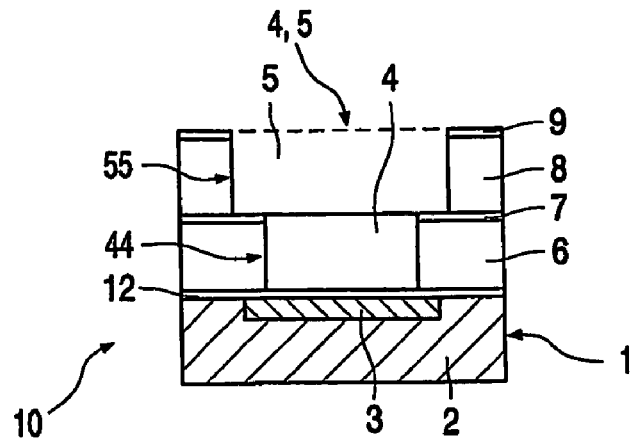
Figure 7:
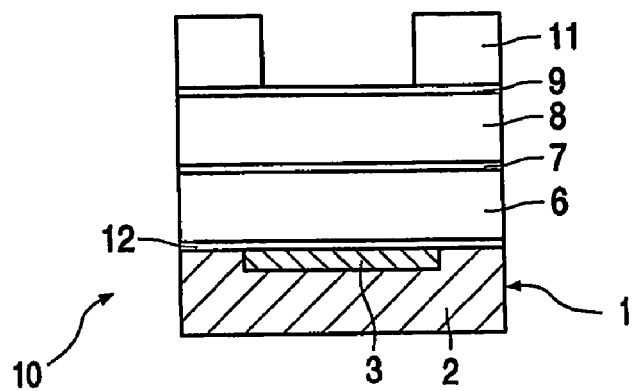
Figure 8:
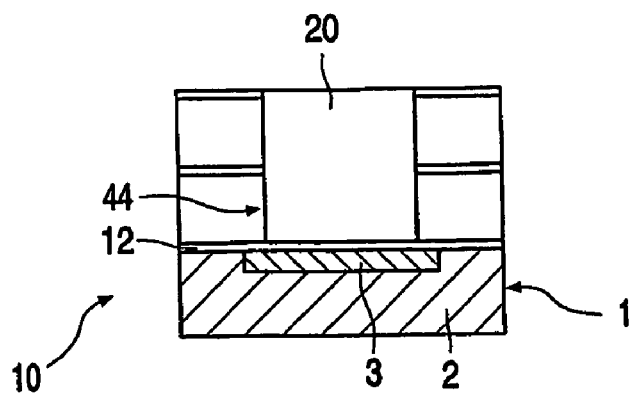
Figure 9:
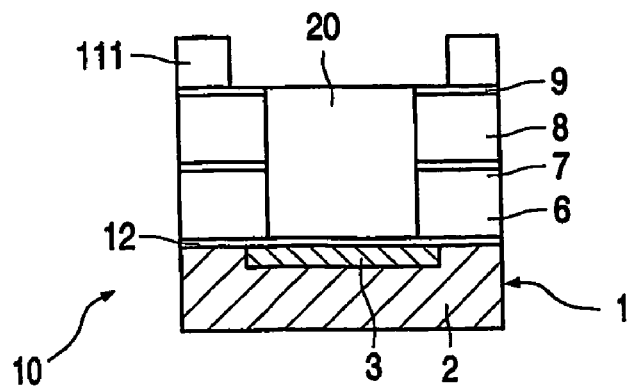
Figure 10:
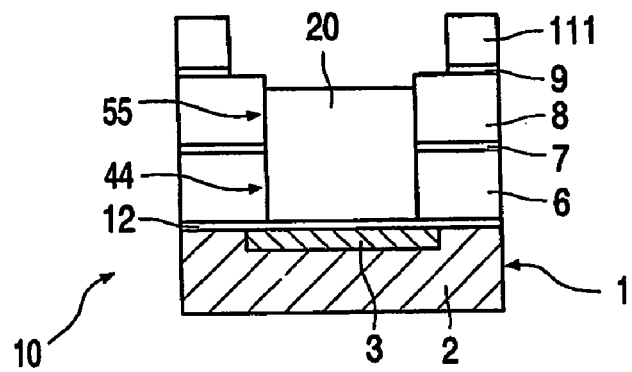
Figure 11:
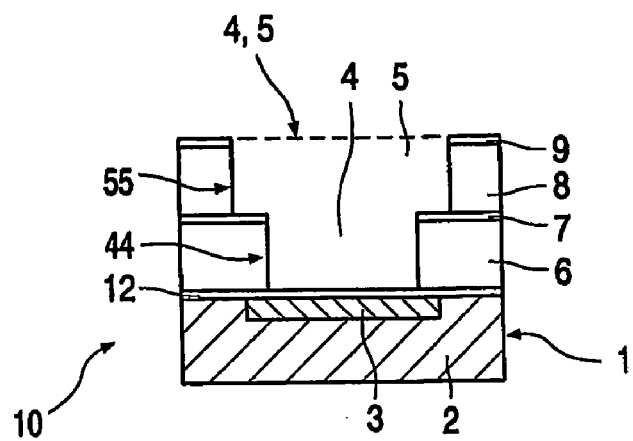

Such a method is known from U.S. Pat. No. 6.362.093, which was published on Mar. 26, 2002. Said document describes (see in particular FIG. 2) how on a contact region in a substrate a stack is deposited of a barrier layer, a first dielectric layer, a hard mask layer, and a second dielectric layer. On top of this structure a patterned photoresist layer is deposited and a via is formed not only in the first dielectric layer but also in the second dielectric layer by plasma etching using a plasma containing a compound of carbon and fluor. Thereafter (see in particular FIG. 3), the via thus formed is filled with an organic material in the form of a spin-on organic material, and a photoresist layer with a different pattern is formed on top of this structure and subsequently a trench is formed in the second dielectric layer by plasma etching. In this process the organic material in both the via in the first dielectric layer and the via in the second dielectric layer is again completely removed. Then both the via and the trench are filled with a conducting material. The organic material in the via has a sacrificial function in that it protects—in particular the bottom of—the via while forming the trench by etching.

A disadvantage of such a method is that it is rather complicated as it comprises several steps for forming the via filled with the sacrificial organic material; such as inter alia the formation of the via by an etching step and filling it by deposition of a spin-on material.

It is therefore an object of the present invention to avoid the above drawbacks and to provide a method that is simple and has fewer steps.

To achieve this, a method of the type described in the opening paragraph is characterized in that the material of the first dielectric layer and the etch conditions during formation of the via in the first dielectric layer by plasma etching are chosen such that during etching the via, said via is at the same time substantially completely filled with the organic material, which organic material is formed from organic material already present within the structure and the plasma. The present invention is firstly based on the surprising recognition that both formation of the via by etching and, during the same process, filling it with organic material is possible provided that in particular for the first dielectric material a suitable material is chosen and provided that the conditions during etching are chosen to be suitable as well.

It appeared that a suitable material for the first dielectric layer is a material which contains organic material. Together with the organic material present in the photoresist layer and the carbon-fluor compound in the plasma, an organic polymer-like material is formed which deposits into the via during its formation. The organic material in the first dielectric layer apparently also plays some role, either as a source of carbon or as a catalyst. Essential conditions during plasma etching in order to obtain the results according to the invention are that the power of the plasma equipment should be between 500 and 2200 Watt. Thus the method according the invention is quick and simple as only one step is needed for forming the via by etching and filling it with a (sacrificial) organic material. Finally, an important and surprising advantage of the method according to the invention is that it does not result in damage to the bottom faces of the trench during trench formation nor to damage to the upper part of the sidewalls of the via during said process. In the known method, on the contrary, the use of a spin-on photoresist to form the sacrificial filling of the via resulted in damages of the kind mentioned during the formation of the trench by plasma etching.

For the material of the first dielectric layer an organic polymer may be used or a hybrid material comprising an inorganic material like porous silicon dioxide comprising also organic material. A suitable example of the latter is LKD-5109, available from TSR Corporation. As a polymer e.g. a material like SILK (which is a trademark of the Dow Chemical Company) may be used. A particular advantage of these materials is that they have lower dielectric constants than pure inorganic silicon dioxide and thus the capacitance of a structure in which two conductors are separated by said materials is reduced, thus favoring high frequency behavior.

In a favorable embodiment of a method according to the invention, the via is formed after deposition of the first dielectric layer and the first hard mask layer, and after forming an opening in the first hard mask layer but before deposition of the second dielectric layer and after forming the via by etching and simultaneously filling said) via with organic material, the second dielectric layer and the second hard mask layer are deposited. In this method the thickness of the via is minimal as it only comprises the first dielectric layer. It has been found that in such a case where the via is relatively thin, it is more easy to form the via and at the same time fill it with organic material. In this embodiment the central part of the second dielectric layer in fact fulfills the function of a sacrificial material during formation of the trench by etching.

In another embodiment, the via is formed after deposition of the second dielectric layer and the via is also formed in the second dielectric layer. Preferably for the second dielectric material the same kind of material is chosen as for the first dielectric material in order to completely fill the via comprising in this case both dielectric layers.

Preferably after the deposition of the second dielectric layer, a second hard mask layer is deposited on top thereof and the via is formed after forming an opening in the second hard mask layer using a photoresist mask to form said opening by means of etching.

Preferably the trench is formed after forming the via and at the same time filling it with the organic material using another photoresist mask formed on top of the second hard mask layer and another etching process.

Providing the trench with a larger width than the width of the via has the advantage that the connection conductor formed within the trench has a low resistance and is more easily aligned with the connection region formed within the via.

Preferably copper is chosen for the electrically conducting material of the connection region and the connection conductor because of its superior conductivity. In that case, before the deposition of the first dielectric layer a barrier layer for copper is deposited on the semiconductor body. Such a layer may be made of tantalum or tantalum nitride. It protects the underlying semiconductor body against contamination by copper.

In another variant, after formation of the via and the trench but before deposition of copper, a thin polymer layer is formed on the walls of the via and the trench. This layer may be formed in a similar way as the sacrificial organic material in the via However, the conditions are now chosen such that only a thin polymer layer is deposited. Afterwards a barrier layer for copper is deposited on the bottom of the via and on the sidewalls of the via and the trench. Thanks to the presence of the polymer layer, the walls of the via and of the trench become smooth and thus a smooth and reliable formation of a barrier layer thereon is possible. Moreover, it appeared that in the case of a barrier layer comprising tantalum, the resistance of the tantalum layer is lower than in the case of the a tantalum layer deposited without the presence of the polymer layer.

Preferably, the etching/filling of the via is carried out using, as the compound of carbon and fluor, a compound which is chosen from the group comprising $CH_2F_2$ and $CH_3F$. Apparently, the chemistry involved in these cases is rather effective, as the results obtained were very satisfying. The remainder of the organic material formed and of the resist present are finally, i.e. at the end of the process, and completely removed by a wet or dry etch process, a so-called stripping process.

The invention also covers a semiconductor device obtained by means of a method according to the invention.

These and other aspects of the invention will be apparent from and elucidated with reference to the embodiment(s) described hereinafter, to be read in conjunction with the drawing, in which FIGS. 1 through 6 are sectional views of a semiconductor device at various stages in the manufacture of the device by means of a method in accordance with the invention, and FIGS. 7 through 11 are sectional views of a semiconductor device at various stages in the manufacture of the device by means of a modification of the method in accordance with the invention.

The figures are diagrammatic and not drawn to scale, the dimensions in the thickness direction being particularly exaggerated for greater clarity. Corresponding parts are generally given the same reference numerals and the same hatching in the various figures.

FIGS. 1 through 6 are sectional views of a semiconductor device at various stages in the manufacture of the device by means of a method in accordance with the invention. The device 10 (see FIG. 1) comprises a semiconductor body 1 which, in this case, is made of silicon but which may alternatively be made of another suitable semiconductor material. As a basis for the body 1 use is made of a p-type silicon substrate 2 in which a semiconductor element 3 is formed, e.g. a p-type region forming a source, drain, base, emitter or the like of a transistor or a part of a diode. In particular in the multi-layer/multi-level technique, element 3 will be formed by a conductor of a lower level of the device 10. The semiconductor element 3 then is formed at another location within the semiconductor body 1.

The method according to the invention continues in this example with the deposition of a barrier layer 12 of tantalum nitride. Subsequently, a first dielectric layer 6 of porous silicon dioxide containing organic material, here LKD-5109 available from TSR Corporation, is deposited in a thickness of 200 to 300 nm. On top of the first dielectric layer 6 a 50 nm thick hard mask layer 7 is deposited, which in this example is made of silicon carbide (SiC). A photoresist layer 11 is deposited thereon and patterned, which photoresist layer is mainly made of methacrylate and is 450 nm thick. The opening in the resist layer 11 is circular here and has a diameter of 250 to 350 nm, which corresponds to the diameter of the connection region 4 to be formed.

Subsequently (see FIG. 2), the device 10 is treated in a plasma etching machine (not shown in the drawing) the plasma of which contains a compound of carbon and fluor, here $CH_3F$. The plasma etching treatment is carried out at a power in the range of 500 to 2200 Watt. First an opening is formed in the first hard mask layer 7. And, according to the invention, at the same time a hole 44 is formed in the first dielectric layer 6 which, at the same time, is filled with an organic material 20. Thus, the method according to the invention is very efficient.

Hereafter (see FIG. 3), on the device 10, a second dielectric layer 8 is deposited, in this case, of the same material as that of the first dielectric layer and having a thickness of 200 to 300 nm. On top thereof a second hard mask layer 9 is deposited, here also of silicon carbide (SiC), having a thickness of 50 nm. Thereon, a fotoresist layer 111 mainly of methacrylate and 450 nm thick is deposited and patterned according to the length and width, here 200 to 400 nm, of the connection conductor 5 to be formed.

Then (see FIG. 4) the second hard mask layer 9 is provided with an opening, corresponding to the opening in the fotoresist layer 111, by means of etching in a plasma comprising $CH_2F_2$ and/or $CH_3F$, here $CH_3F$.

Subsequently (see FIG. 5), a trench 55 is formed by continued etching until the organic material 20 (see FIG. 6) is reached. From that moment etching is continued by means of plasma etching with a plasma comprising a mixture of $N_2/O_2$. Now (see FIG. 6), the organic material 20 in the via 44 is removed until the bottom of the via 44 is reached. At the same time the (remainder of) resist layer 111 is removed. An important advantage of the method according to the invention is that the "shoulders" formed at the interface between the via 44 and the trench 55 are not damaged. This is quite contrary to the known method in which such damage occurs. In this example a thin polymer layer—not shown in the Figure—is deposited on the walls of the via 44. Thereafter a further barrier layer, preferably of tantalum,—also not shown in the drawing—is deposited on said polymer layer. Then the via 44 and the trench 55 are filled, in this example, with copper to form the connection region 4 and the connection conductor 5, the upper level thereof being represented in FIG. 6 by means of a dashed line 4,5. The copper is deposited in this example by an electroplating technique.

The process will now be continued in a way similar to the known processes in order to complete the device 10. The steps involved are not illustrated in the drawing. Usual process steps are a CMP process and possibly the process steps involved in the formation of further connection regions and connection conductors which are recessed in a dielectric, followed by a CMP process. Then for example a silicon carbide layer is deposited in which openings are made in which a connection metal like aluminum is deposited, e.g. as a blanket layer, followed by photolithography and etching. Finally, individual devices 10 may be obtained by means of a separation process like sawing.

Below, a second example, which is modification of the first example, is given of a method according to the invention.

FIGS. 7 through 11 are sectional views of a semiconductor device at various stages in the manufacture of the device by means of a modification of the method in accordance with the invention. The method according to the invention applied in this example shows some similarities with that of the first example and therefore we refer here to the description of the first example for certain details. Here, only the predominant differences will be briefly discussed.

As a basis (see FIG. 7) for the manufacture of device 10 use is made of a semiconductor body 1 which again comprises a silicon substrate 2 with a semiconductor element 3 on top of which a barrier layer 12, a first dielectric layer 6 and a first hard mask layer 7 are deposited. Now, on top thereof a second dielectric layer 8, here of the same material as the first dielectric layer 6 is deposited and on top of said second dielectric layer a second hard mask layer 9 is deposited which is provided with a patterned resist layer 11.

Then (see FIG. 8) an opening is etched in the second hard mask layer 9 and subsequently a hole 44 is etched throughout the structure 10 until the barrier layer 12 is reached. At the same time, the hole 44 thus formed is filled with an organic material 20. The hole 44 has the size of the desired connection region 4 to be formed.

Subsequently (see FIG. 9) a further patterned resist layer 111 is deposited on top of the second hard mask layer 9 having the width and the length of the desired connection conductor 5 to be formed. Then (see FIG. 10) an etching operation is started in which both the organic material 20 and the unprotected parts of the second hard mask layer 9 and the second dielectric layer 8 are etched away. After reaching the level of the via 44 etching is continued in a similar way as in the first example such that the remainder of the organic material 20 and the (remainder) of the resist 111 is removed. Finally, the situation (see FIG. 11) is reached where both the via 44 and the trench 55 are completely formed. Both are again filled with copper 4,5, indicated by the dashed line, to form connection region 4 and connection conductor 5.

It will be obvious that the invention is not limited to the examples described herein, and that within the scope of the invention many variations and modifications are possible to those skilled in the art.

For example, semiconductor devices having a different geometry and size may be made. The substrate may comprise an insulating material like glass and the semiconductor body may then be formed e.g. by a so-called substrate transfer technique. The dielectric layers may comprise other so-called low-K materials.

It is also to be noted that the device to be made may comprise further active and/or passive semiconductor elements or electronic elements like a (large number of) diodes, transistors and/or resistors and/or capacitors, e.g. in the form of an IC (=Integrated Circuit).

The invention claimed is:

1. Method of manufacturing a semiconductor device with a semiconductor body and a substrate comprising at least one semiconductor element and provided with at least one connection region and an overlying stripe-shaped connection conductor connected to the connection region which connection conductor and connection region are both recessed in a dielectric material, where subsequently a first dielectric layer, a hard mask layer, and a second dielectric layer are deposited on the semiconductor body, where at the location of the connection region to be formed, a via is formed in the first dielectric layer by plasma etching using a plasma containing a compound of carbon and fluorine, and in the presence of a patterned photoresist layer deposited on top of the connection region and at the location of the connection conductor to be formed, a trench is formed in the second dielectric layer by plasma etching, which via and trench are filled with an electrically conducting material in order to form, respectively, the connection region and the connection conductor, and where before the trench is formed, the already formed via is filled with an organic material, characterized in that the material of the first dielectric layer and the etch conditions during formation of the via in the first dielectric layer by plasma etching are chosen such that during etching the via, said via is at the same time substantially completely filled with the organic material, the organic material being formed from organic material already present within the already formed via and within the plasma, wherein the organic material in the via acts as a sacrificial material thereby protecting the via during plasma etching and during trench formation, resulting in enhanced dimensional integrity of the via and trench structure.

2. Method according to claim 1, characterized in that for the material of the first dielectric layer a material is chosen which contains organic material.

3. Method according to claim 2, characterized in that for the material of the first dielectric layer a polymer is chosen.

4. Method according to claim 2, characterized in that for the material of the first dielectric layer a material is chosen comprising porous silicon dioxide comprising organic material.

5. Method according to claim 1, characterized in that during plasma etching the via, the power setting is chosen between 500 and 2200 Watts.

6. Method-according to claim 1, characterized in that the via is formed after deposition of the first dielectric layer and the first hard mask layer, and after forming an opening in the first hard mask layer and after forming the via by etching and simultaneously filling said via with organic material, the second dielectric layer and the second hard mask layer are deposited.

7. Method according to claim 1, characterized in that the via is formed after deposition of the second dielectric layer, and the via is formed also in the second dielectric layer.

8. Method according to claim 1, characterized in that the trench is formed after forming the via and at the same time filling it with the organic material using a photoresist mask.

9. Method according to claim 8, characterized in that the width of the trench is chosen to be larger than the width of the via.

10. Method according to claim 1, characterized in that copper is chosen forte electrically conducting material.

11. Method according to claim 10, characterized in that before the deposition of the first dielectric layer, a barrier layer for copper is deposited on the semiconductor body.

12. Method according to claim 10, characterized in that after formation of the via and the trench but before deposition of the copper, a thin polymer layer is formed on the walls of the via and the trench and a further barrier layer for copper is deposited on the bottom of the via and on the side walls of the via and the trench.

13. Method according to claim 1, characterized in that a further hard mask layer is deposited on top of the second dielectric layer.

14. Method according to claim 1, characterized in that as the compound of carbon and fluor, a compound is chosen from the group comprising $CH_2F_2$ and $CH_3F$.

15. Semiconductor device obtained with a method according to claim 1.

* * * * *